(12) United States Patent
Liu

(10) Patent No.: US 10,045,445 B2
(45) Date of Patent: Aug. 7, 2018

(54) FLEXIBLE DISPLAY SUBSTRATE AND MANUFACTURING METHOD THEREOF

(71) Applicant: Wuhan China Star Optoelectronics Technology Co., Ltd., Wuhan (CN)

(72) Inventor: Zhe Liu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 406 days.

(21) Appl. No.: 14/914,647

(22) PCT Filed: Dec. 28, 2015

(86) PCT No.: PCT/CN2015/099100
§ 371 (c)(1),
(2) Date: Feb. 26, 2016

(87) PCT Pub. No.: WO2017/088239
PCT Pub. Date: Jun. 1, 2017

(65) Prior Publication Data
US 2018/0035553 A1 Feb. 1, 2018

(30) Foreign Application Priority Data
Nov. 23, 2015 (CN) .......................... 2015 1 0818540

(51) Int. Cl.
*H05K 1/00* (2006.01)
*H05K 5/00* (2006.01)
(Continued)

(52) U.S. Cl.
CPC ........... *H05K 5/0017* (2013.01); *H05K 1/028* (2013.01); *H05K 3/0011* (2013.01)

(58) Field of Classification Search
CPC ...... H05K 5/0017; H05K 3/0011; H05K 1/028
(Continued)

(56) References Cited

U.S. PATENT DOCUMENTS

| 2014/0346473 A1* | 11/2014 | Park | H01L 51/5256 257/40 |
| 2015/0034935 A1* | 2/2015 | Choi | H01L 51/0097 257/40 |

(Continued)

FOREIGN PATENT DOCUMENTS

| CN | 104392901 A | 3/2015 |
| KR | 10-2011-0079117 | 7/2011 |

*Primary Examiner* — Sherman Ng
(74) *Attorney, Agent, or Firm* — Leong C. Lei

(57) ABSTRACT

The invention provides a flexible display substrate and manufacturing method thereof. The manufacturing method for flexible display substrate patternizes the inorganic layer between the two organic layers on the flexible substrate so that the two organic layer contacting each other at the gaps on the inorganic separation layer, so as to avoid the potential damage on the films during the subsequent laser-lift-off process. The method is simple and the manufacturing process is efficient. The flexible display substrate of the present invention uses a structure of stacked four thin film layers to realize effective water/oxygen blocking, thus avoiding display devices' eroding. The inner two organic layers of the flexible substrate contact each other directly at the gaps of the inorganic separation layer, and the high adhesion strength between the upper and lower film layers of the flexible substrate helps avoiding film-peeling inner the stacked structure.

15 Claims, 7 Drawing Sheets

(51) Int. Cl.
*H05K 3/00* (2006.01)
*H05K 1/02* (2006.01)

(58) Field of Classification Search
USPC .......................................... 174/254
See application file for complete search history.

(56) References Cited

U.S. PATENT DOCUMENTS

2015/0287949 A1* 10/2015 Okamoto ............ H01L 51/5004
257/40
2016/0141551 A1* 5/2016 Seo ..................... H01L 51/5253
257/40

\* cited by examiner

FLEXIBLE DISPLAY SUBSTRATE AND MANUFACTURING METHOD THEREOF

BACKGROUND OF THE INVENTION

1. Field of the Invention

The present invention relates to the field of display, and in particular to a flexible display substrate and manufacturing method thereof.

2. The Related Arts

Currently in the field of display technology, the technologies applicable for flexible displays are various, for example, including a conventional liquid crystal display (LCD), the bi-stable LCD, organic light-emitting diode (OLED) display, electrophoretic display, electrochromism (EC) display, electroluminescent (EL) display, and so on. The flexible OLED (flexible organic light-emitting diode, FOLED) display, compared to other flexible displays, provides more advantages, such as self-luminous display, response speed, high brightness, wide viewing angle, and low cost. Moreover, FOLED display is based on flexible organic materials display, and can be curled, folded, or even as part of a wearable computer, and hence is widely applied to portable products and military special areas requiring good display The conventional flexible display mainly uses a flexible substrate with thickness less than 100 microns, for example, ultra-thin glass, stainless steel and plastic film substrates, and so on. The method for preparing a flexible display substrate generally comprises: forming a flexible substrate on the carrier substrate, then forming the display unit, and finally peeling flexible substrate off the rigid carrier substrate. After the display unit prepared on the flexible substrate is peeled from the carrier substrate, it is necessary to ensure not only that the whole entirety can be bent and have flexibility, but also can be waterproof to effectively block water vapor and oxygen molecules penetrating from the back of the substrate to erode the upper display components. Therefore, the improvement on the flexible substrate of a single layer structure using organic polymer substrate material must be made. Present technologies has provided an approach of using a kind of stacked flexible substrate to improve the capacity of blocking water and oxygen, i.e., the use of thin films of "organic-inorganic-organic-inorganic" stacking multilayer as the flexible substrate. In this process, an important issue to be addressed is the insufficient adhesion strength between the "organic-inorganic" layers causing the separation of films during the subsequent peeling-off, for example the laser-lift-off.

SUMMARY OF THE INVENTION

The object of the present invention is to provide a manufacturing method for flexible display substrate, by patterning the inorganic layer between the two organic layers on the flexible substrate so that the two organic layer contacting each other at the gaps on the inorganic separation layer, so as to avoid the potential damage on the films during the subsequent laser-lift-off process. The method is simple and the manufacturing process is efficient.

Another object of the present invention is to provide a flexible display substrate, which having a structure of stacked four thin film layers to realize effective water/oxygen blocking, thus avoiding display devices' eroding. The inner two organic layers of the flexible substrate contacting each other directly at the gaps of the inorganic separation layer, and the high adhesion strength between the upper and lower film layers of the flexible substrate helps avoiding film-peeling inner the stacked structure.

To achieve the above object, the present invention provides a manufacturing method for flexible display substrate, which comprises: Step 1: providing a carrier substrate, and forming a first organic layer on the carrier substrate; Step 2: forming a patterned first inorganic separation layer on the first organic layer, the first inorganic separation layer comprising a plurality of inorganic separation units arranged with gaps in-between the units; Step 3: forming a second organic layer on the first organic layer and the first inorganic separation layer, the second organic layer contacting the first organic layer at the gaps between the plurality of inorganic separation units; Step 4: forming a second inorganic separation layer on the second organic layer to obtain a flexible substrate comprising the first organic layer, the first inorganic separation layer, the second organic layer and the second inorganic separation layer; Step 5: fabricating the display components on the flexible substrate, and Step 6: peeling the flexible substrate off the carrier substrate.

Specifically, Step 2 comprises: Step 21: providing an electrostatic spinning device, the electrostatic pinning device comprising a nozzle, a working platform disposed below the nozzle, a left and right rail, and a front and rear rail; placing the carrier substrate on the working platform; Step 22: starting the electrostatic spinning device, spraying an electrostatic spinning solution through the nozzle onto the carrier substrate positioned below, while the carrier substrate moved with the working platform along the left and right rail, and the front and rear rail, so that interweaving electrostatic spun fibers formed on the first organic layer to obtain a polymer fiber layer having a mesh structure; Step 23: depositing an inorganic film layer on the first organic layer, and the polymer fiber layer, a portion of the inorganic film layer directly adhered to electrostatic spun fibers of the polymer fiber layer, another portion directly attached to the first organic layer to form a plurality of spaced inorganic separation units; the plurality of inorganic separation units being divided by the electrostatic spun fibers; and Step 24: removing the polymer fiber layer, and the inorganic material film adhered to the polymer fiber layer to obtain the first inorganic separation layer which having a plurality of inorganic separation units.

In Step 22, the electrostatic spun fiver has a diameter of 10 nm-1000 µm.

The polymer fiber layer formed in Step 22 is of a mesh structure arranged regularly; and the plurality of inorganic separation units of the inorganic separation layer formed in Step 24 is arranged in an array.

The distance between two adjacent electrostatic spun fibers in the same direction is 10 nm-1000 µm.

The polymer fiber layer formed in Step 22 is of a mesh structure arranged irregularly.

In Step 24, a solution immersion method, ultrasonic method, or a combination of both methods is used to remove the polymer fiber layer and the inorganic film layer adhered to the polymer fiber layer.

In Step 1, the carrier substrate is made of glass; in Step 6, a laser lift-off method is used to peel the flexible substrate off the carrier substrate.

The present invention also provides a flexible display substrate, which comprises: a carrier substrate, a flexible substrate disposed on the carrier substrate, and a certain number of display units fabricated on the flexible substrate; the flexible substrate comprising: a first organic layer, a first inorganic separation layer, a second organic layer and a second inorganic separation layer, formed in sequence on the carrier substrate; the first inorganic separation layer comprising a plurality of inorganic separation units arranged with gaps in-between, the second organic layer contacting the first organic layer at the gaps.

The plurality of inorganic separation units are arranged in an array or arranged irregularly.

The present invention further provides a manufacturing method for flexible display substrate, which comprises: Step 1: providing a carrier substrate, and forming a first organic layer on the carrier substrate; Step 2: forming a patterned first inorganic separation layer on the first organic layer, the first inorganic separation layer comprising a plurality of inorganic separation units arranged with gaps in-between the units; Step 3: forming a second organic layer on the first organic layer and the first inorganic separation layer, the second organic layer contacting the first organic layer at the gaps between the plurality of inorganic separation units; Step 4: forming a second inorganic separation layer on the second organic layer to obtain a flexible substrate comprising the first organic layer, the first inorganic separation layer, the second organic layer and the second inorganic separation layer; Step 5: fabricating a certain number of display units on the flexible substrate, and Step 6: peeling the flexible substrate off the carrier substrate; wherein step 2 comprising: Step 21: providing an electrostatic spinning device, the electrostatic pinning device comprising a nozzle, a working platform disposed below the nozzle, a left and right rail, and a front and rear rail; placing the carrier substrate on the working platform; Step 22: starting the electrostatic spinning device, spraying an electrostatic spinning solution through the nozzle onto the carrier substrate positioned below, while the carrier substrate moved with the working platform along the left and right rail, and the front and rear rail, so that interweaving electrostatic spun fibers formed on the first organic layer to obtain a polymer fiber layer having a mesh structure; Step 23: depositing an inorganic film layer on the first organic layer, and the polymer fiber layer, a portion of the inorganic film layer directly adhered to electrostatic spun fibers of the polymer fiber layer, another portion directly attached to the first organic layer to form a plurality of spaced inorganic separation units; the plurality of inorganic separation units being divided by the electrostatic spun fibers; and Step 24: removing the polymer fiber layer, and the inorganic material film adhered to the polymer fiber layer to obtain the first inorganic separation layer having a plurality of inorganic separation units; wherein in Step 22, the electrostatic spun fiver having a diameter of 10 nm-1000 μm; in Step 1, the carrier substrate being made of glass; in Step 6, a laser lift-off method is used to peel the flexible substrate off the carrier substrate.

Compared to the known techniques, the present invention provides the following advantages: the present invention provides a flexible display substrate and manufacturing method thereof. The manufacturing method for flexible display substrate patterns the inorganic layer between the two organic layers on the flexible substrate so that the two organic layer contacting each other at the gaps on the inorganic separation layer, so as to enhance the ability of avoiding the potential damage on the films during the subsequent peeling-off process. The method is simple and the manufacturing process is efficient. The flexible display substrate of the present invention uses a structure of stacked four thin film layers to realize effective water/oxygen blocking, thus avoiding display devices' eroding. The inner two organic layers of the flexible substrate contacting each other directly at the gaps of the inorganic separation layer, and the high adhesion strength between the upper and lower film layers of the flexible substrate helps avoiding film-peeling inner the stacked structure.

BRIEF DESCRIPTION OF THE DRAWINGS

To illustrate the technical solution of the embodiments, a brief description of the drawings is given as follows according to the present invention. Apparently, the drawings described below show only example embodiments of the present invention and for those having ordinary skills in the art, other drawings may be easily obtained from these drawings without paying any creative efforts. In the drawings.

DETAILED DESCRIPTION OF THE PREFERRED EMBODIMENTS

To further explain the technical means and effect of the present invention, the following refers to embodiments and drawings for detailed description.

Figure 1:
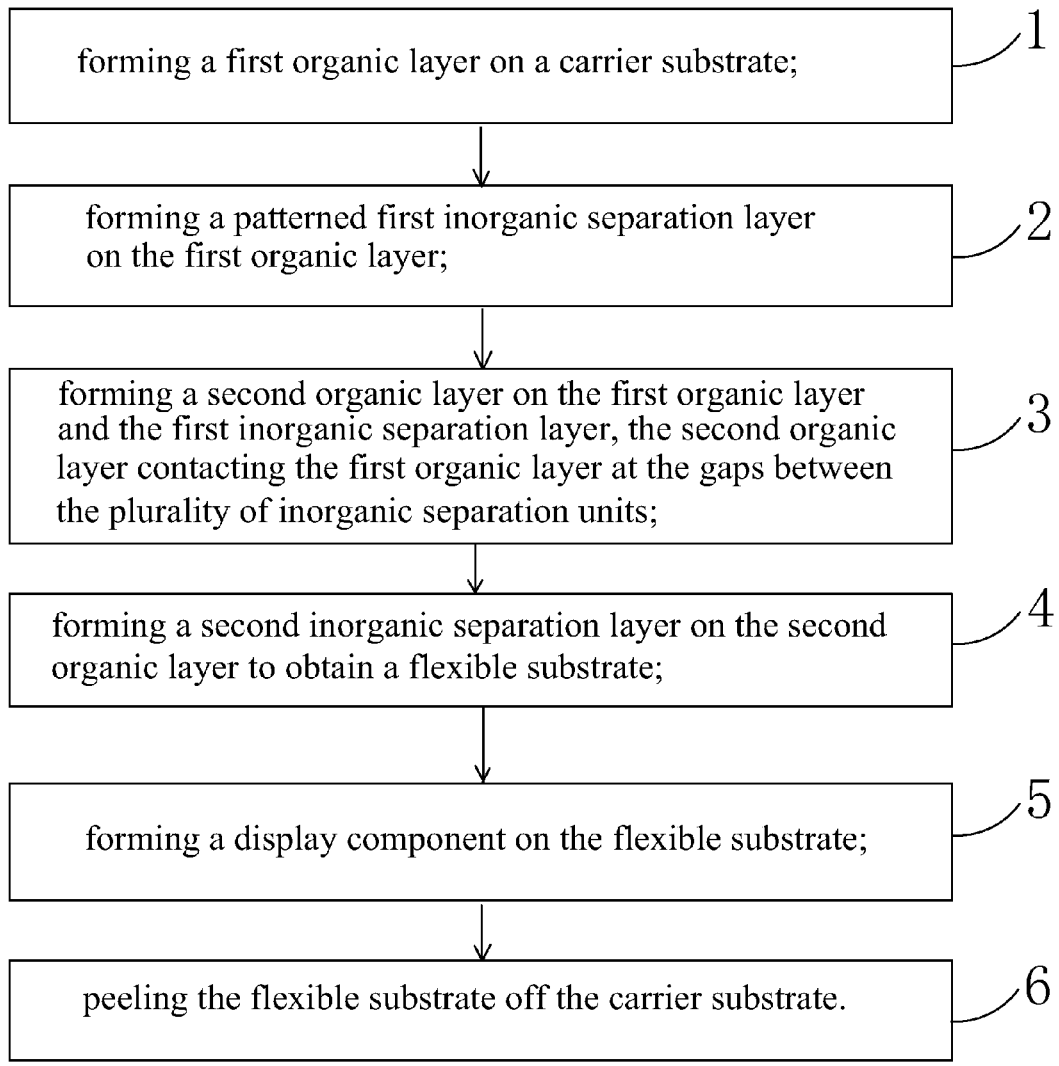
FIG. 1 is a schematic view showing a flowchart of the manufacturing method for flexible display substrate provided by an embodiment of the present invention.
Figure 2:
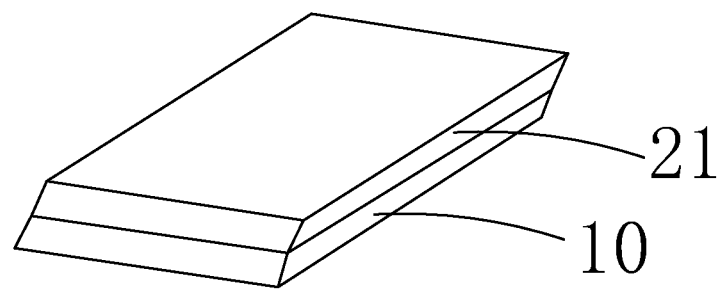
FIG. 2 is a schematic view showing Step 1 of the manufacturing method for flexible display substrate provided by an embodiment of the present invention.

Refer to FIG. 1. The present invention provides a manufacturing method for flexible display substrate, which comprises:

Step 1: as shown in FIG. 2, providing a carrier substrate 10, and coating to form a first organic layer 21 on the carrier substrate 10.

Specifically, the carrier substrate is made of glass.

Step 2: forming a patterned first inorganic separation layer 22 on the first organic layer 21, the first inorganic separation layer 22 comprising a plurality of inorganic separation units 221 arranged with gaps in-between the units.

Specifically, referring to FIGS. 3-5, and FIG. 8, Step 2 comprises:

Step 21: providing an electrostatic spinning device 50, the electrostatic pinning device 50 comprising a nozzle 51, a working platform 52 disposed below the nozzle 51, a left and right rail 53, and a front and rear rail 54; after the solidifying the first organic layer 21, placing the carrier substrate 10 on the working platform 52.

Figure 3:
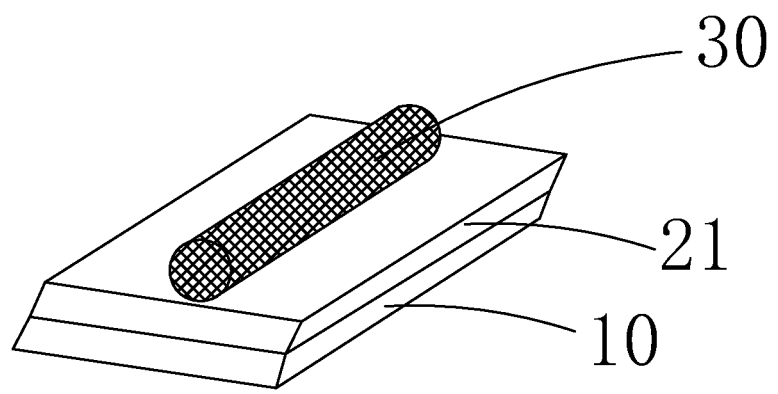
FIG. 3 is a schematic view showing Step 22 of the manufacturing method for flexible display substrate provided by an embodiment of the present invention.
Figure 8:
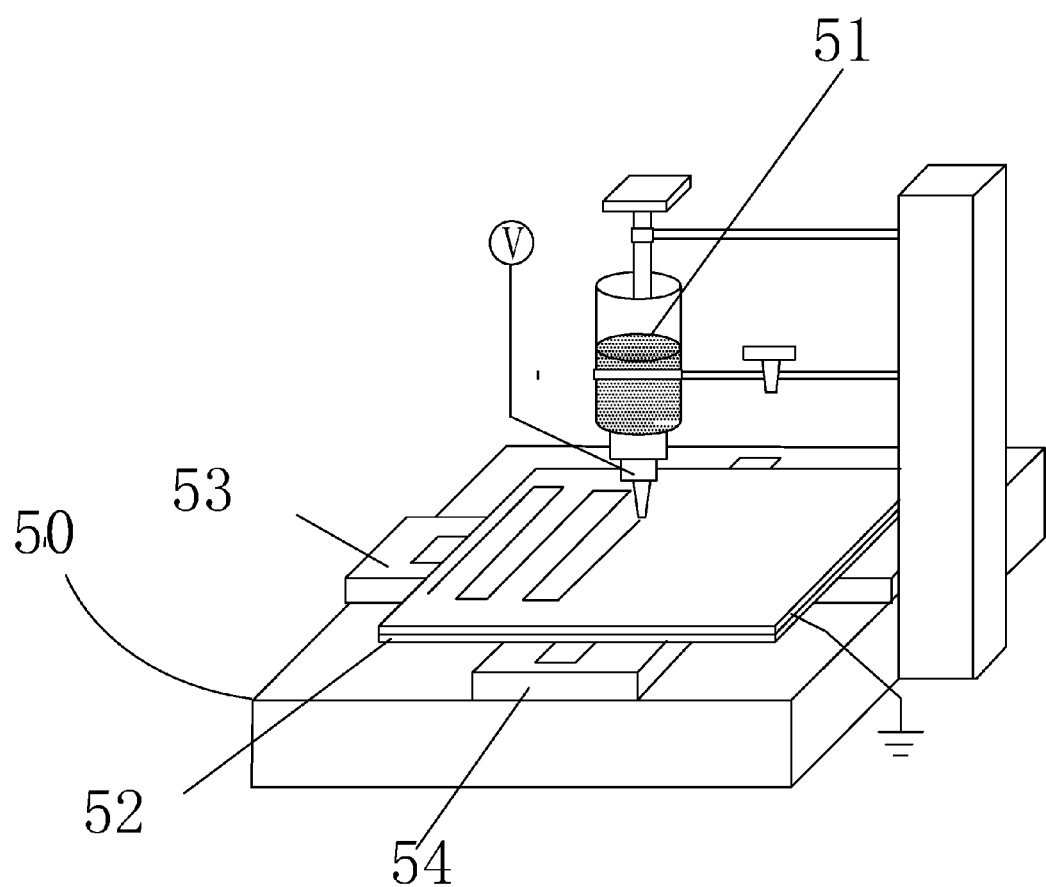
FIG. 8 is a schematic view showing Step 22 of the manufacturing method for flexible display substrate provided by an embodiment of the present invention.

Step 22: as shown in FIG. 3 and FIG. 8, starting the electrostatic spinning device 50, spraying an electrostatic spinning solution through the nozzle 51 onto the carrier substrate 10 positioned below, while the carrier substrate 10 moved with the working platform 52 along the left and right rail 53, and the front and rear rail 54, so that interweaving electrostatic spun fibers formed on the first organic layer 21 to obtain a polymer fiber layer 30 having a mesh structure.

Specifically, in Step 22, the electrostatic spun fiver has a diameter of 10 nm-1000 μm.

Figure 4:
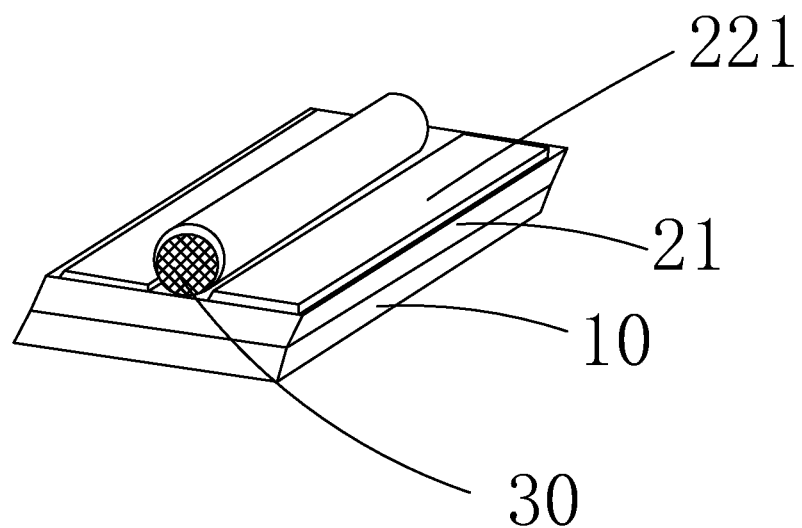
FIG. 4 is a schematic view showing Step 23 of the manufacturing method for flexible display substrate provided by an embodiment of the present invention.

Step 23: as shown in FIG. 4, depositing an inorganic film layer on the first organic layer 21 and the polymer fiber layer 30, a portion of the inorganic film layer directly adhered to electrostatic spun fibers of the polymer fiber layer 30, another portion directly attached to the first organic layer 21 to form a plurality of spaced inorganic separation units 221; the plurality of inorganic separation units 221 being divided by the electrostatic spun fibers.

Figure 5:
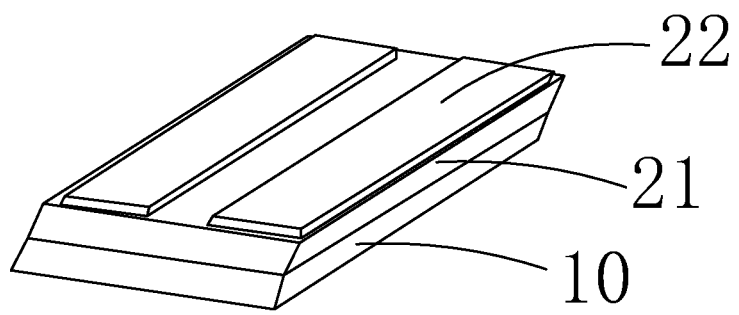
FIG. 5 is a schematic view showing Step 24 of the manufacturing method for flexible display substrate provided by an embodiment of the present invention.

Step 24: as shown in FIG. 5, removing the polymer fiber layer 30 and the inorganic material film adhered to the polymer fiber layer to obtain the first inorganic separation layer 22 having a plurality of inorganic separation units 221.

Specifically, in Step 24, a solution immersion method, ultrasonic method, or a combination of both methods is used to remove the polymer fiber layer 30 and the inorganic film layer adhered to the polymer fiber layer.

Figure 9:
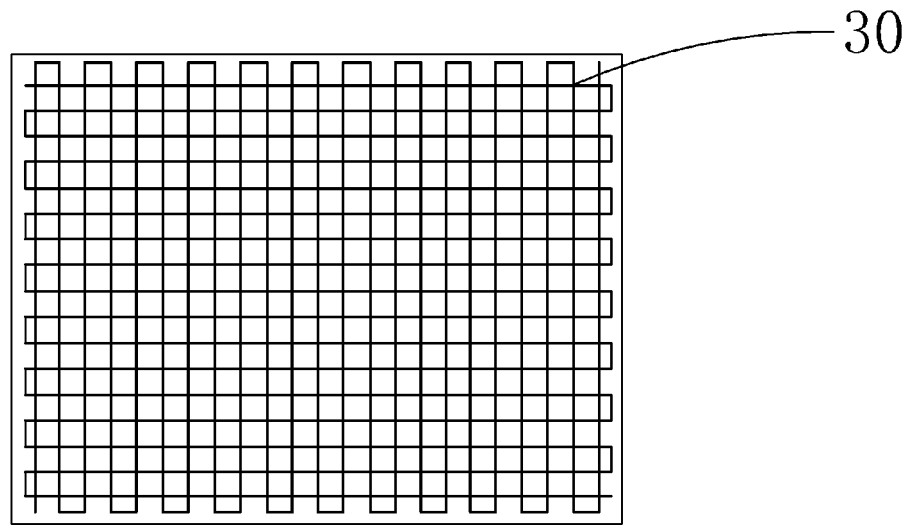
FIG. 9 is a schematic view showing the structure of the polymer fiber layer obtained in Step 22 of the manufacturing method for flexible display substrate provided by an embodiment of the present invention.
Figure 10:
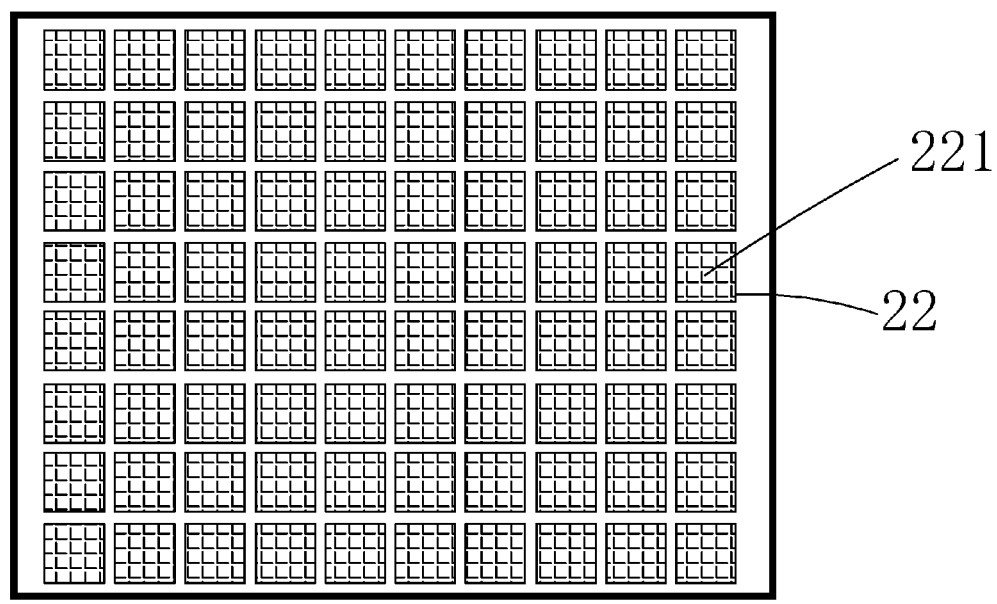
FIG. 10 is a schematic view showing the structure of the first inorganic separation layer obtained in Step 24 of the manufacturing method for flexible display substrate provided by an embodiment of the present invention.

Specifically, the polymer fiber layer 30 formed in Step 22 can be of a mesh structure arranged regularly or of a mesh structure arranged irregularly. In the present embodiment, as shown in FIG. 9, the polymer fiber layer 30 formed in Step 22 is of a mesh structure arranged regularly. Specifically, the distance between two adjacent electrostatic spun fibers in the same direction is 10 nm-1000 μm. After removing the polymer fiber layer 30 and the inorganic material film adhered to the polymer fiber layer 30, the first inorganic separation layer 22 obtained has a plurality of inorganic separation units 221, as shown in FIG. 10. In Step 24, the plurality of inorganic separation units 221 of the inorganic separation layer 22 is arranged in an array.

Figure 6:
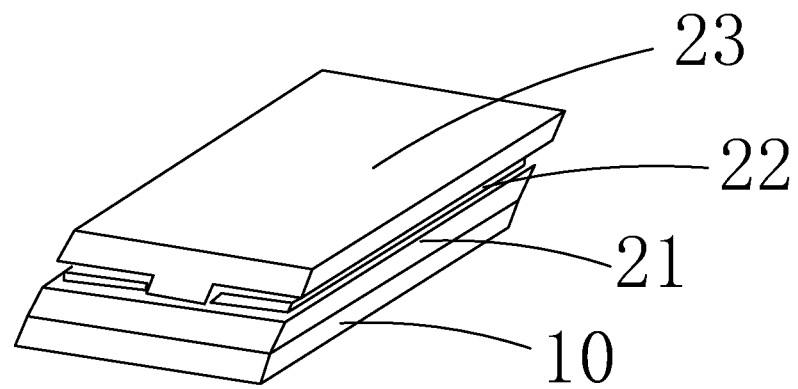
FIG. 6 is a schematic view showing Step 3 of the manufacturing method for flexible display substrate provided by an embodiment of the present invention.

Step 3: as shown in FIG. 6, forming a second organic layer 23 on the first organic layer 21 and the first inorganic separation layer 22, the second organic layer 23 contacting the first organic layer 21 at the gaps in-between the plurality of inorganic separation units 221.

Figure 7:
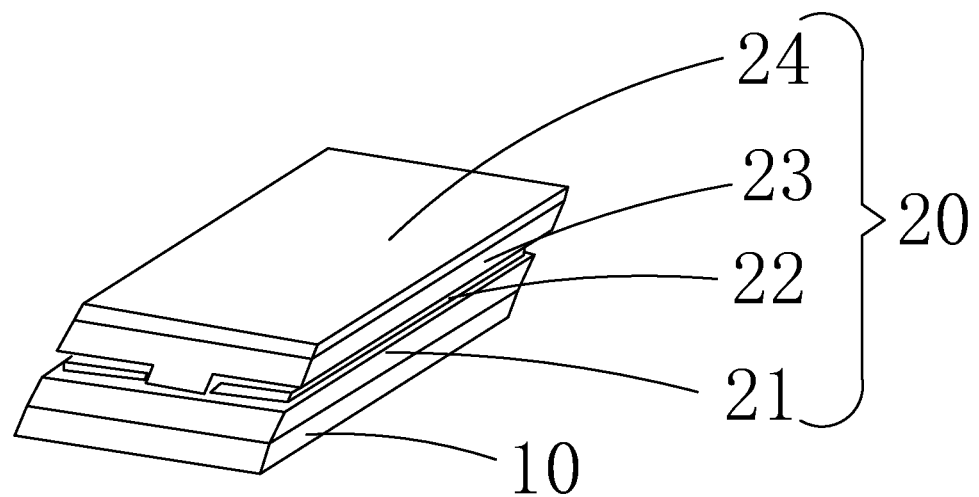
FIG. 7 is a schematic view showing Step 4 of the manufacturing method for flexible display substrate provided by an embodiment of the present invention.

Step 4: as shown in FIG. 7, forming a second inorganic separation layer 24 on the second organic layer 23 to obtain a flexible substrate 20 comprising the first organic layer 21, the first inorganic separation layer 22, the second organic layer 23 and the second inorganic separation layer 24.

Step 5: forming a certain number of display components 40 on the flexible substrate 20.

Step 6: peeling the flexible substrate 20 and the display components off the carrier substrate 10.

Specifically, in Step 6, a laser lift-off method is used to peel the flexible substrate 20 off the carrier substrate 10.

In the manufacturing method for flexible display substrate of the present invention, a first organic layer is coated on the carrier substrate. After the first organic layer is solidified, an electrostatic spinning method is used to obtain interweaving electrostatic spun fibers of mesh structure formed on the first organic layer. Then an inorganic film layer is formed through deposition on the mesh electrostatic spun fibers, and a solution immersion and ultrasonic method is used to get rid of electrostatic spun fibers and inorganic film layer material adhered to electrostatic spun fibers, and the remaining inorganic film layer forms the first layer inorganic separation layer which having a separation pattern. The first inorganic separation layer comprises a plurality of inorganic separation units with gaps in-between the units. Thereafter, the second organic layer is coated on the first inorganic separation layer, so that the first organic layer and second organic layer are directly connected at the gaps to strengthen the adhesion between the upper and lower layers. Finally, the second inorganic separation layer is formed through deposition to obtain a flexible substrate having a four-layered structure, to achieve effective blocking of oxygen/water so as to avoid display devices' erosion. The use of electrostatic pinning technology patterning the first inorganic separation layer, compared to the use of "mask-lithography-etch" technology patterning the first inorganic separation layer, the present invention can improve the process efficiency and reduce production costs. Moreover, the method reduces the presence of the adhesive layer, and improves the reliability of the organic polymer substrate.

Figure 11:
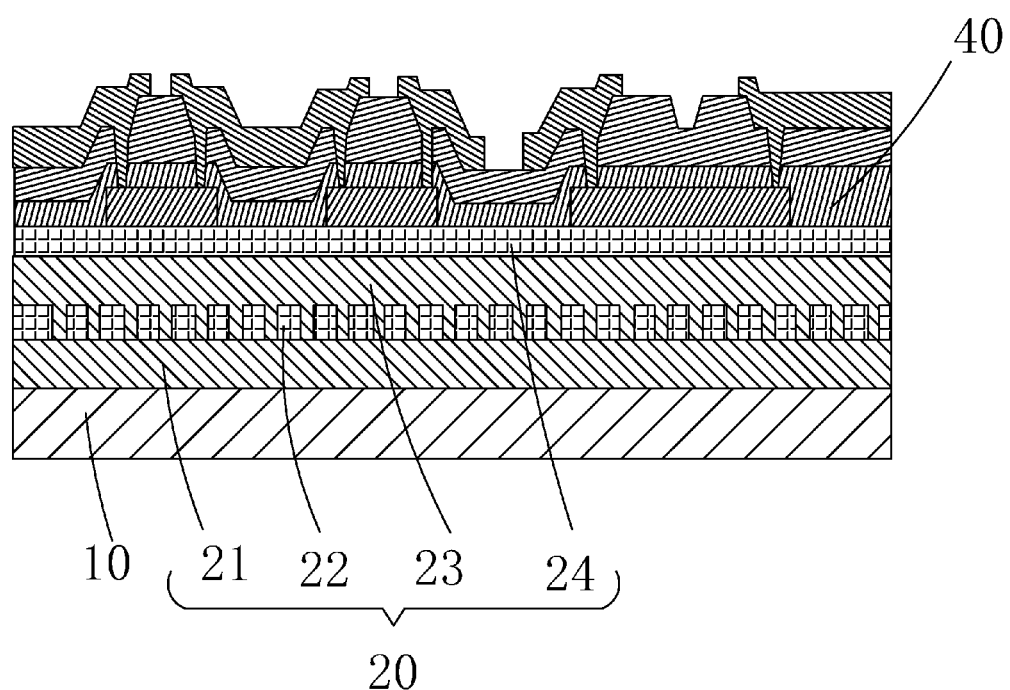
FIG. 11 is a schematic view showing the structure of the flexible display substrate provided by an embodiment of the present invention.

Refer to FIG. 11. The present invention provides a flexible display substrate, which comprises: a carrier substrate 10, a flexible substrate 20 disposed on the carrier substrate 10, and a display unit 40 fabricated on the flexible substrate 20.

The flexible substrate 20 comprises: a first organic layer 21, a first inorganic separation layer 22, a second organic layer 23 and a second inorganic separation layer 24, formed in sequence on the carrier substrate 10.

The first inorganic separation layer 21 comprises a plurality of inorganic separation units 221 arranged with gaps in-between, the second organic layer 23 contacting the first organic layer 21 at the gaps.

The plurality of inorganic separation units is arranged in an array or irregularly.

In summary, the present invention provides a flexible display substrate and manufacturing method thereof. The manufacturing method for flexible display substrate patternizes the inorganic layer between the two organic layers on the flexible substrate so that the two organic layers contacting each other at the gaps on the inorganic separation layer, so as to enhance the ability of avoiding the potential damage on the films during the subsequent peeling-off process. The method is simple and the manufacturing process is efficient. The flexible display substrate of the present invention uses a structure of stacked four thin film layers to realize effective water/oxygen blocking to avoid display devices' eroding. The inner two organic layers of the flexible substrate contacting each other directly at the gaps of the inorganic separation layer, and the high adhesion strength between the upper and lower film layers of the flexible substrate helps avoiding film-peeling inner the stacked structure.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A manufacturing method for flexible display substrate, which comprises:
   Step 1: providing a carrier substrate, and forming a first organic layer on the carrier substrate;
   Step 2: forming a patterned first inorganic separation layer on the first organic layer, the first inorganic separation layer comprising a plurality of inorganic separation units arranged with gaps in-between the units;
   Step 3: forming a second organic layer on the first organic layer and the first inorganic separation layer, the second organic layer contacting the first organic layer at the gaps between the plurality of inorganic separation units;
   Step 4: forming a second inorganic separation layer on the second organic layer to obtain a flexible substrate comprising the first organic layer, the first inorganic separation layer, the second organic layer and the second inorganic separation layer;
   Step 5: forming a display component on the flexible substrate, and
   Step 6: peeling the flexible substrate off the carrier substrate.

2. The manufacturing method for flexible display substrate as claimed in claim 1, wherein Step 2 comprises:
   Step 21: providing an electrostatic spinning device, the electrostatic pinning device comprising a nozzle, a working platform disposed below the nozzle, a left and right rail, and a front and rear rail; placing the carrier substrate on the working platform;
   Step 22: starting the electrostatic spinning device, spraying an electrostatic spinning solution through the nozzle onto the carrier substrate positioned below, while the carrier substrate moved with the working platform along the left and right rail, and the front and rear rail, so that interweaving electrostatic spun fibers formed on the first organic layer to obtain a polymer fiber layer having a mesh structure;
   Step 23: depositing an inorganic film layer on the first organic layer, and the polymer fiber layer, a portion of the inorganic film layer directly adhered to electrostatic spun fibers of the polymer fiber layer, another portion directly attached to the first organic layer to form a plurality of spaced inorganic separation units; the plurality of inorganic separation units being divided by the electrostatic spun fibers; and
   Step 24: removing the polymer fiber layer, and the inorganic material film adhered to the polymer fiber layer to obtain the first inorganic separation layer having a plurality of inorganic separation units.

3. The manufacturing method for flexible display substrate as claimed in claim 2, wherein in Step 22, the electrostatic spun fiver has a diameter of 10 nm-1000 μm.

4. The manufacturing method for flexible display substrate as claimed in claim 2, wherein the polymer fiber layer formed in Step 22 is of a mesh structure arranged regularly; and the plurality of inorganic separation units of the inorganic separation layer formed in Step 24 is arranged in an array.

5. The manufacturing method for flexible display substrate as claimed in claim 4, wherein the distance between two adjacent electrostatic spun fibers in the same direction is 10 nm-1000 μm.

6. The manufacturing method for flexible display substrate as claimed in claim 2, wherein the polymer fiber layer formed in Step 22 is of a mesh structure arranged irregularly.

7. The manufacturing method for flexible display substrate as claimed in claim 2, wherein in Step 24, a solution immersion method, ultrasonic method, or a combination of both methods is used to remove the polymer fiber layer and the inorganic film layer adhered to the polymer fiber layer.

8. The manufacturing method for flexible display substrate as claimed in claim 1, wherein in Step 1, the carrier substrate is made of glass; in Step 6, a laser lift-off method is used to peel the flexible substrate and the display components off the carrier substrate.

9. A flexible display substrate, which comprises: a carrier substrate, a flexible substrate disposed on the carrier substrate, and a display unit disposed on the flexible substrate;
   the flexible substrate comprising: a first organic layer, a first inorganic separation layer, a second organic layer and a second inorganic separation layer, formed in sequence on the carrier substrate; and
   the first inorganic separation layer comprising a plurality of inorganic separation units arranged with gaps in-between, the second organic layer contacting the first organic layer at the gaps.

10. The flexible display substrate as claimed in claim 9, wherein the plurality of inorganic separation units are arranged in an array or arranged irregularly.

11. A manufacturing method for flexible display substrate, which comprises:
    Step 1: providing a carrier substrate, and forming a first organic layer on the carrier substrate;
    Step 2: forming a patterned first inorganic separation layer on the first organic layer, the first inorganic separation layer comprising a plurality of inorganic separation units arranged with gaps in-between the units;
    Step 3: forming a second organic layer on the first organic layer and the first inorganic separation layer, the second organic layer contacting the first organic layer at the gaps between the plurality of inorganic separation units;
    Step 4: forming a second inorganic separation layer on the second organic layer to obtain a flexible substrate comprising the first organic layer, the first inorganic separation layer, the second organic layer and the second inorganic separation layer;
    Step 5: forming a display component on the flexible substrate, and
    Step 6: peeling the flexible substrate and the display components off the carrier substrate;
    wherein Step 2 comprises:
    Step 21: providing an electrostatic spinning device, the electrostatic pinning device comprising a nozzle, a working platform disposed below the nozzle, a left and right rail, and a front and rear rail; placing the carrier substrate on the working platform;
    Step 22: starting the electrostatic spinning device, spraying an electrostatic spinning solution through the nozzle onto the carrier substrate positioned below, while the carrier substrate moved with the working platform along the left and right rail, and the front and rear rail, so that interweaving electrostatic spun fibers formed on the first organic layer to obtain a polymer fiber layer having a mesh structure;

Step 23: depositing an inorganic film layer on the first organic layer, and the polymer fiber layer, a portion of the inorganic film layer directly adhered to electrostatic spun fibers of the polymer fiber layer, another portion directly attached to the first organic layer to form a plurality of spaced inorganic separation units; the plurality of inorganic separation units being divided by the electrostatic spun fibers; and Step 24: removing the polymer fiber layer, and the inorganic material film adhered to the polymer fiber layer to obtain the first inorganic separation layer having a plurality of inorganic separation units;

wherein in Step 22, the electrostatic spun fiver has a diameter of 10 nm-1000 µm.

wherein in Step 1, the carrier substrate is made of glass; in Step 6, a laser lift-off method is used to peel the flexible substrate off the carrier substrate.

12. The manufacturing method for flexible display substrate as claimed in claim 11, wherein the polymer fiber layer formed in Step 22 is of a mesh structure arranged regularly; and the plurality of inorganic separation units of the inorganic separation layer formed in Step 24 is arranged in an array.

13. The manufacturing method for flexible display substrate as claimed in claim 12, wherein the distance between two adjacent electrostatic spun fibers in the same direction is 10 nm-1000 µm.

14. The manufacturing method for flexible display substrate as claimed in claim 11, wherein the polymer fiber layer formed in Step 22 is of a mesh structure arranged irregularly.

15. The manufacturing method for flexible display substrate as claimed in claim 11, wherein in Step 24, a solution immersion method, ultrasonic method, or a combination of both methods is used to remove the polymer fiber layer and the inorganic film layer adhered to the polymer fiber layer.

* * * * *